United States Patent
Bailey et al.

(10) Patent No.: US 10,925,167 B2
(45) Date of Patent: Feb. 16, 2021

(54) MODULAR EXPANSION CARD BUS

(71) Applicant: Amazon Technologies, Inc., Seattle, WA (US)

(72) Inventors: Kevin Bailey, Seattle, WA (US); Priscilla Lam, Seattle, WA (US); Darin Lee Frink, Lake Tapps, WA (US); Jason Alexander Harland, Seattle, WA (US); Felipe Enrique Ortega Gutierrez, Tacoma, WA (US)

(73) Assignee: Amazon Technologies, Inc., Seattle, WA (US)

(*) Notice: Subject to any disclaimer, the term of this patent is extended or adjusted under 35 U.S.C. 154(b) by 0 days.

(21) Appl. No.: 16/549,868

(22) Filed: Aug. 23, 2019

(65) Prior Publication Data

US 2019/0380208 A1 Dec. 12, 2019

Related U.S. Application Data

(62) Division of application No. 15/934,668, filed on Mar. 23, 2018, now Pat. No. 10,398,032.

(51) Int. Cl.
| | |
|---|---|
| *H05K 1/11* | (2006.01) |
| *H05K 1/14* | (2006.01) |
| *H05K 1/18* | (2006.01) |
| *G06F 11/20* | (2006.01) |
| *G06F 13/40* | (2006.01) |
| *H05K 3/30* | (2006.01) |

(52) U.S. Cl.
CPC ............ *H05K 1/184* (2013.01); *G06F 11/20* (2013.01); *G06F 13/4068* (2013.01); *H05K 1/183* (2013.01); *H05K 3/30* (2013.01)

(58) Field of Classification Search
CPC .... H01R 12/721; H05K 1/142; H05K 7/1461; H05K 1/184; H05K 1/183; G06F 11/20; G06F 13/4068
See application file for complete search history.

(56) References Cited

U.S. PATENT DOCUMENTS

| | | | |
|---|---|---|---|
| 5,656,869 A | 8/1997 | Gluskoter et al. | |
| 5,784,650 A | 7/1998 | Gulick et al. | |
| 5,819,005 A * | 10/1998 | Daly | G11B 27/031 704/200 |

(Continued)

OTHER PUBLICATIONS

A. Pratt, "DC Voltage Level Overview", Jul. 12, 2017, XP002657942, pp. 1-10.

(Continued)

*Primary Examiner* — Yuriy Semenenko
(74) *Attorney, Agent, or Firm* — Robert C. Kowert; Kowert, Hood, Munyon, Rankin & Goetzel, P.C.

(57) ABSTRACT

A computing system includes a circuit board assembly and multiple expansion cards connected to one another and also connected to the circuit board assembly. The connected expansion cards form a modular expansion card bus that allows the expansion cards to communicate between each other without routing the communications through the circuit board assembly. In some embodiments, the expansion cards are mounted on a tray that includes mounting pins that engage mounting slots of the expansion cards, allowing for simple installation of various combinations of expansion cards connected together to form a modular expansion card bus.

19 Claims, 10 Drawing Sheets

(56) References Cited

U.S. PATENT DOCUMENTS

| | | | |
|---|---|---|---|
| 5,943,215 A | 8/1999 | Carney et al. | |
| 6,122,161 A * | 9/2000 | Gierut | H05K 1/142 361/788 |
| 6,496,376 B1 * | 12/2002 | Plunkett | G06F 13/409 361/729 |
| 7,075,796 B1 | 7/2006 | Pritchett | |
| 7,215,535 B2 | 5/2007 | Pereira | |
| 7,567,434 B1 | 7/2009 | Sivertsen | |
| 7,791,889 B2 | 9/2010 | Belady et al. | |
| 9,791,900 B1 | 10/2017 | Beall et al. | |
| 10,049,068 B2 * | 8/2018 | Hu | G06F 13/38 |
| 10,398,032 B1 * | 8/2019 | Bailey | |
| 2003/0188067 A1 * | 10/2003 | Okin | G05B 19/0423 710/301 |
| 2004/0017114 A1 | 1/2004 | Tseng et al. | |
| 2005/0207133 A1 | 9/2005 | Pavier et al. | |
| 2007/0028126 A1 | 2/2007 | Wu et al. | |
| 2009/0009007 A1 | 1/2009 | Kato et al. | |
| 2009/0125655 A1 | 5/2009 | Jones et al. | |
| 2010/0008038 A1 | 1/2010 | Coglitore | |
| 2011/0197005 A1 | 8/2011 | Liao et al. | |
| 2011/0254414 A1 | 10/2011 | Li et al. | |
| 2011/0317342 A1 | 12/2011 | Li | |
| 2013/0070412 A1 | 3/2013 | Ge et al. | |
| 2014/0129753 A1 * | 5/2014 | Schuette | G06F 13/4068 710/301 |
| 2014/0273552 A1 * | 9/2014 | Ganesan | H05K 1/144 439/65 |
| 2015/0181746 A1 * | 6/2015 | Mullen | G06F 1/183 361/679.31 |
| 2016/0043484 A1 * | 2/2016 | Brodsky | H01R 12/716 439/65 |
| 2017/0027077 A1 * | 1/2017 | Nicoloff | H05K 1/181 |

OTHER PUBLICATIONS

E.C.W. de Jong, P.T.M. Vaessen, "DC Power Distribution for Server Farms", Sep. 30, 2007, XP002657943, pp. 1-14.

U.S. Appl. No. 12/797,483, filed Mar. 12, 2013, Michael W. Schrempp.

U.S. Appl. No. 15/012,409, filed Feb. 1, 2016, Kypros Constantinides.

\* cited by examiner

MODULAR EXPANSION CARD BUS

This application is a divisional of U.S. patent application Ser. No. 15/934,668, filed Mar. 23, 2018, which is hereby incorporated by reference herein in its entirety.

BACKGROUND

In many servers, such as rack-mounted servers in a data center, circuit boards for the servers are housed in a chassis, such as a rack-mounted chassis. Typically, the chassis houses a motherboard assembly, additional circuit boards, such as memory modules or networking modules, coupled to the motherboard assembly, and a power supply for the electrical component in the chassis. The chassis may also house hard disk drives, fans, or other components.

Often additional circuit boards included in a server chassis are connected to the motherboard assembly via cables or soldered connections. However, in the case of cabling, the cables may block airflow through the chassis. Also, in the case of soldered connections, it may be difficult, complex, and/or labor intensive to initially solder one or more connections between an additional circuit board and a motherboard assembly, and it may also be difficult to subsequently disconnect the additional circuit board connected to the motherboard assembly via the one or more soldered connections.

For server systems comprising multiple additional circuit boards, communications between the additional circuit boards may be routed through the mother board via connections between the additional circuit boards and the motherboard assembly. However, such communications routed through the motherboard may consume signal capacity and processing capacity of the motherboard that could otherwise be used to perform other operations.

Figure 1:
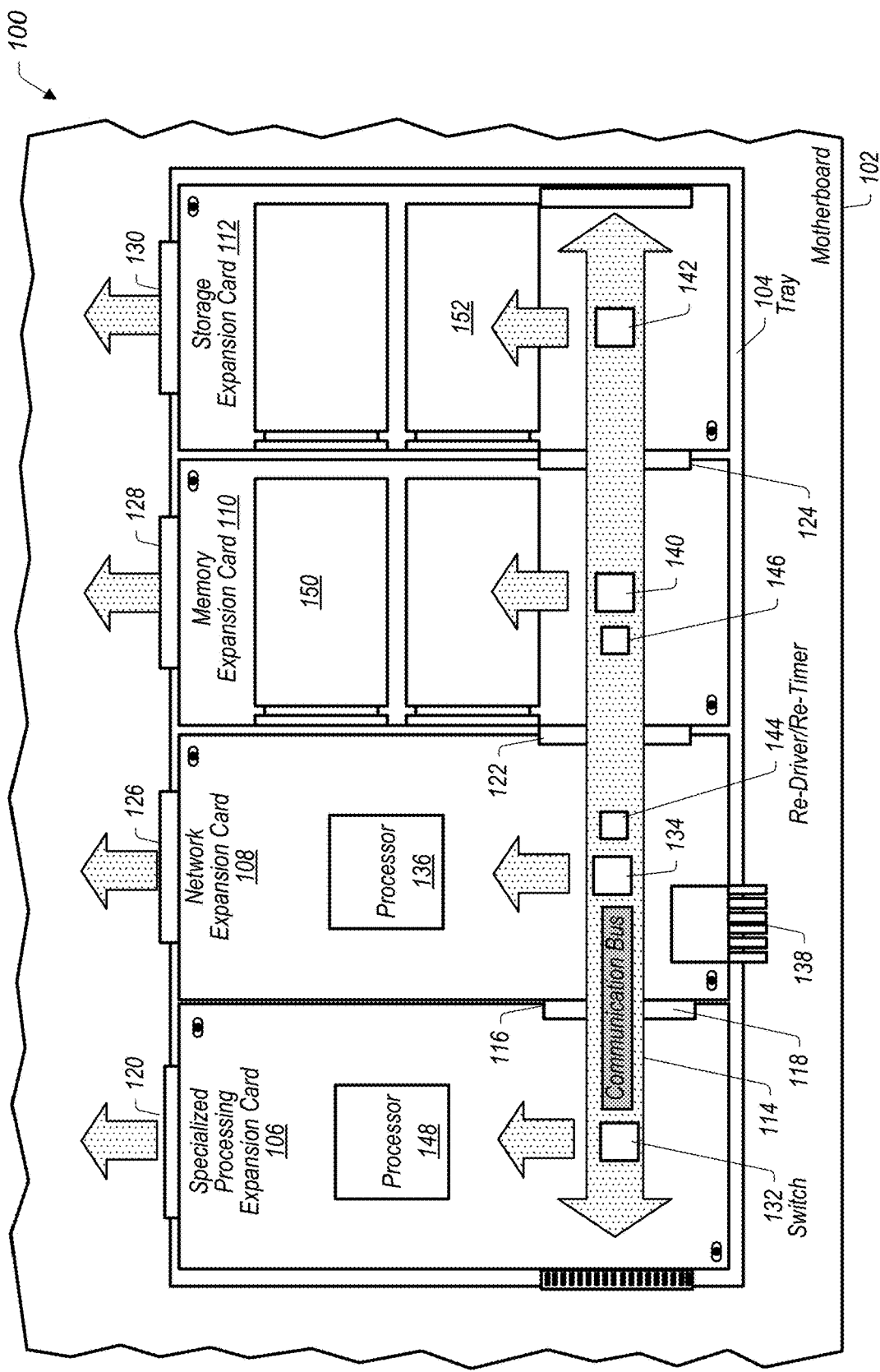
FIG. 1 illustrates a computing system comprising expansion cards connected to one another to form a modular expansion card bus, wherein the expansion cards are also connected to a motherboard, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a modular expansion card bus, and systems and method of using such a device, are disclosed. Also methods of producing and modifying such a device are disclosed.

According to some embodiments, a computing system includes a motherboard, a tray, and multiple expansion cards mounted on the tray. Each of the expansion cards includes a connector on a first edge of the respective expansion card configured to couple with a corresponding connector of the motherboard, a connector on a second edge of the respective expansion card configured to couple with a corresponding connector of an adjacent one of the expansion cards, and a mounting slot configured to restrict movement of the respective expansion card on the tray in a first direction and allow at least some movement of the respective expansion card on the tray in a second direction such that the first connector of the respective expansion card can be aligned with the corresponding connector of the motherboard while remaining connected to the corresponding connector of the adjacent expansion card.

According to some embodiments, a system includes a tray and a plurality of cards mounted on the tray. Respective ones of the cards comprise a connector on a first edge of the respective card configured to couple with a corresponding connector of a circuit board, a connector on a second edge of the respective card configured to couple with a corresponding connector of an adjacent one of the cards mounted on the tray, and a mounting slot configured to restrict movement of the respective card in a first direction and allow at least some movement of the respective card in a second direction.

According to some embodiments, a method includes connecting a plurality of cards mounted in a tray to one another via respective first connectors of the cards and corresponding connectors of adjacent ones of the cards, wherein each of the cards includes a slot configured to engage with a respective mounting pin of the tray, and connecting each of the plurality of cards to a circuit board upon which the tray is mounted, wherein connecting each of the plurality of cards to the circuit board comprises laterally adjusting a position of one or more of the connected cards to align a second connector of the one or more cards with a corresponding connector of the circuit board.

As used herein, "expansion card" means, for example, a card that can be connected to a circuit board assembly of a computer system, such as a motherboard, to add functions or enhance the capability of the computer system.

As used herein, "circuit board" includes a board or card that carries one or more circuits or portions thereof. A circuit board may include, for example, a printed circuit board made of epoxy-glass and metal layers. As used herein, "circuit board assembly" includes any combination of elements that includes one or more circuit boards. In some embodiments, a circuit board may be a motherboard for a computing system.

As used herein, "chassis" means a structure or element that supports another element or to which other elements can be mounted. A chassis may have any shape or construction, including a frame, a sheet, a plate, a box, a channel, or a combination thereof.

As used herein, a "rack" means a rack, container, frame, or other element or combination of elements that can contain or physically support one or more computer systems. In some embodiments, a rack may be an EAI (electronics industries alliance) standard rack. For example a 42 U rack, or other standard sized rack.

As used herein, "computing" includes any operations that can be performed by a computer, such as computation, data storage, data retrieval, or communications.

As used herein, "computing system" includes any of various computing systems or components thereof. One example of a computing system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

In some computing systems expansion cards, such as memory cards, storage cards, networking cards and/or special purpose processing cards may be coupled to a circuit board assembly, such as a motherboard, to provide additional resources and capabilities to the circuit board assembly. Often such expansion cards are connected to a circuit board assembly via one or more cables. However, in such computing systems, the cables may obstruct airflow through the chassis, thus reducing heat transfer from heat producing components of the computer system, such as may be included in the circuit board assembly and the expansion cards. Other computing systems may use soldered connections to connect expansion cards to a circuit board assembly. However, such systems may lack flexibility due to the permanent nature of the soldered connections. Also soldered connections may increase labor costs and complexity of assembling such systems.

Additionally, such computer systems may separately connect one or more separate expansion cards to a common circuit board assembly, such as a motherboard, without direct connections between the expansion cards. Thus communications between expansion cards are routed through the circuit board assembly, e.g. the motherboard, consuming signal capacity and/or processor cycles that could otherwise be used to perform additional tasks.

In some embodiments, in contrast to the computer systems described above, a computer system with a modular expansion card bus may include expansion cards with connectors oriented to attach the expansion card to both a circuit board assembly, such as a motherboard, and an adjacent expansion card. Such connectors may connect the expansion card to the circuit board assembly and an adjacent expansion card without using cables or soldered connections. In some embodiments, the expansion cards of a modular expansion card bus may be connected to one another using printed circuit board (PCB) edge connectors of the respective expansion cards of the modular expansion card bus. The PCB edge connectors of the expansion cards may only minimally obstruct airflow through a chassis of the computer system, as compared to cable connections, or may not obstruct air flow through the chassis of the computer system at all. Furthermore, in some embodiments, adjacently connected expansion cards may communicate between each other directly without routing communications through an attached circuit board assembly, such as motherboard. Thus, signal load and processing load on the circuit board assembly, e.g. the motherboard, may be reduced as compared to systems that route communications between expansion cards through the circuit board assembly, e.g. the mother board.

In some embodiments, a computer system with a modular expansion card bus may include a tray with mounting pins and the expansion cards of the modular expansion card bus may include mounting slots configured to engage with the mounting pins of the tray. In some embodiments, a tray may be configured to accept various combinations of expansion cards, such as different combinations of networking expansion cards, special purpose processing expansion cards, storage expansion cards, etc. Also, each of the expansion cards may include a side connector oriented along a side of the expansion card configured to connect to a corresponding connector of an adjacent expansion card mounted in the tray. Additionally, each of the expansion cards mounted in the tray may include an additional edge connector oriented perpendicular to the first edge connector, wherein the additional edge connector is configured to connect to a corresponding connector of a circuit board assembly, such as a motherboard, to connect the expansion card to the circuit board assembly.

In some embodiments, different combinations of expansion cards may be selected for inclusion in a modular expansion card bus of a particular computing system based on performance requirements of the particular computing system. In some embodiments, combinations of types of expansion cards may be customized for different computing systems depending on performance requirements of the different computing systems. In some embodiments, different types of expansion cards, such as specialized processing expansion cards, networking expansion cards, storage expansion cards, etc., may have a common form factor and may include both a first edge connector oriented to connect to an adjacent expansion card and a second edge connector oriented to connect to a motherboard, wherein the location and orientation of the first and second edge connector is common across various types of expansion cards. In such embodiments, a common manufacturing process, such as an automated circuit board assembly process, may be used to assemble customized computing systems having different combinations of expansion cards connected into respective modular expansion card buss, using the same assembly process or apparatus.

FIG. 1 illustrates a computing system comprising expansion cards connected to one another to form a modular expansion card bus, wherein the expansion cards are also connected to a motherboard, according to some embodiments.

In some embodiments, a computing system, such as computing system 100, includes a circuit board assembly, such as motherboard 102, a tray, such as tray 104, and modular expansion cards, such as specialized processing expansion card 106, network expansion card 108, memory expansion card 110, and storage expansion card 112. Each of the expansion cards includes a first connector oriented on a first edge of the expansion card, wherein the first connector is configured to connect the expansion card to a corresponding connector of the circuit board assembly. Each of the expansion cards also includes at least one second connector oriented on a second edge of the expansion card, wherein the second connector is configured to directly connect the expansion card to a corresponding connector of an adjacent expansion card mounted in the tray. In some embodiments, the multiple ones of the expansion cards mounted in the tray and each connected to an adjacent expansion card via second side edge connectors form a modular expansion card bus, such as communication bus 114, that enables respective ones of the modular expansion cards to directly communicate with each other without routing communications between the expansion cards through a circuit board assembly, such as motherboard 102.

For example, network expansion card 108 includes a first side edge connector 116 configured to couple with a corresponding connector 118 of specialized processing expansion card 106, which is mounted in tray 104 adjacent to network expansion card 108. Additionally, specialized processing expansion card 106 includes an additional edge connector 120 on a second edge of specialized processing expansion card 106. In some embodiments, edge connector 116 and edge connector 120 are oriented perpendicular to one another. In addition network expansion card 108 includes a corresponding connector 122 configured to connect to a first side edge connector of memory expansion card 110. In a similar manner memory expansion card 110 and storage expansion card 112 are connected via corresponding connector 124 of memory expansion card 110 connected to an edge connector of storage expansion card 112. Collectively the connections between adjacent side edge connectors of specialized processing expansion card 106, network expansion card 108, memory expansion card 110 and storage expansion card 112 form a modular expansion card communication bus 114 between the respective expansion cards 106, 108, 110, and 112.

In some embodiments, in addition to being connected to an adjacent expansion card, respective ones of the expansion cards of a modular expansion card bus may be connected to a circuit board assembly, such as motherboard 102. For example, specialized processing expansion card 106 is connected to motherboard 102 via edge connector 120 engaged with a corresponding connector of motherboard 102. Additionally, network expansion card 108 is connected to motherboard 102 via connector 126, memory expansion card 110 is connected to motherboard 102 via connector 128, and storage expansion card 112 is connected to motherboard 102 via connector 130.

In some embodiments, various ones of the expansion cards of a modular expansion card bus may include additional components that support communications via the modular expansion card bus. For example, in some embodiments, respective ones of the expansion cards of a modular expansion card bus may include switches in the communication lanes of the modular expansion card bus that can selectively route signals along the bus to other ones of the expansion cards or route signals off of the bus and onto one or more processing circuits of the expansion card. In some embodiments the signals or outputs generated in response to the signals may further be routed to a circuit board assembly, such as motherboard 102, via a second edge connector of an expansion card, such as edge connector 120 of specialized processing card 106. For example, network expansion card 108 includes switch 134 in communication lanes of communication bus 114, wherein the switch 134 may selectively route communications to processor 136 of network expansion card 108. In some embodiments, network expansion card 108 may further route communications from communication bus 114 to the motherboard 102 via second edge connector 126 or may route communications over a network via connector 138. In some embodiments, other ones of the expansion cards of a modular expansion card bus may include switches configured to selectively route communications on the modular expansion card bus or to route communications to or from destinations outside of the communication lanes of the modular expansion card bus. For example, specialized processing expansion card 106 includes switch 132, memory expansion card 110 includes switch 140 and storage expansion card 112 includes switch 142.

In some embodiments, respective ones of the expansion cards of a modular expansion card bus may further include one or more re-timers or re-drivers to coordinate communications between expansion cards and to extend a communication range of a signal being communicated over a modular expansion card bus. For example, network expansion card 108 includes re-driver/re-timer 144 and memory expansion card 110 includes re-driver/re-timer 146. In some embodiments, expansion cards may include only a re-driver, only a re-timer, or both. In some embodiments, each expansion card may include a re-driver, a re-timer, or both. A re-driver may increase a strength of a received signal to increase a range across which the signal may be further transmitted. In some embodiments, a re-timer may adjust signal timing due to delays incurred in transmitting the signal from a signal source to the re-timer and may further send the adjusted signal to a further destination for the signal, such as on another expansion card.

In some embodiments, a modular expansion card bus may include various combinations of expansion card types. For example, communication bus 114 includes a processing type expansion card, a networking type expansion card, and a storage type expansion card. In some embodiments, a processing type expansion card, such as specialized processing expansion card 106, may include various types of processor(s) 148. For example, processor(s) 148 may include application specific integrated circuits (ASICs), field programmable gate arrays (FPGAs), graphics processing units (GPUs), system on a chip circuits (SoCs), or various other types of processors that may augment capabilities of a circuit board assembly, such as motherboard 102, to which the modular expansion card bus is connected.

In some embodiments, a storage type expansion card may provide memory to augment a circuit board assembly, such as motherboard 102, and/or additional storage capacity for use by a circuit board assembly, such as motherboard 102, or for use by other ones of the expansion cards, such as specialized processing expansion card 106. For example, memory expansion card 110 includes memory device 150 and storage expansion card 112 includes solid-state storage device 152.

In some embodiments, any number of expansion cards may be connected to each other in a daisy chain fashion to form a modular expansion card bus. In some embodiments, various types of connectors may be used to connect an expansion card to a circuit board assembly, such as motherboard 102. For example, in some embodiments, printed circuit board edge connector may be used to connect an expansion card to a riser connector of a motherboard and an additional printed circuit board edge connector may also be used to connect an expansion card to an adjacent expansion card. In some embodiments, a printed circuit board edge connector may provide a high speed connection between adjacent expansion cards. For example, in some embodiments a printed circuit board edge connector and modular expansion card bus formed by multiple expansion cards connected via printed circuit board edge connectors may communicate according to a PCIe generation 4 (peripheral component interconnect express) or later standard. For example, in some embodiments, a modular expansion card bus may communicate at speeds of 16 gigatransfers per second (16 GT/s) or more. Though in some embodiments, a modular expansion card bus may communicate at other speeds.

In some embodiments, a modular expansion card bus may include a selected combination of expansion cards tailored to provide particular capabilities to a particular computing system, wherein different combinations of expansion cards are selected for different computing systems. In some embodiments, a mounting tray comprising mounting pins and corresponding mounting slots of respective ones of a set of expansion cards selected to be included in a modular expansion card bus may allow for simple and fast installation of customized sets of expansion cards.

Figure 2:
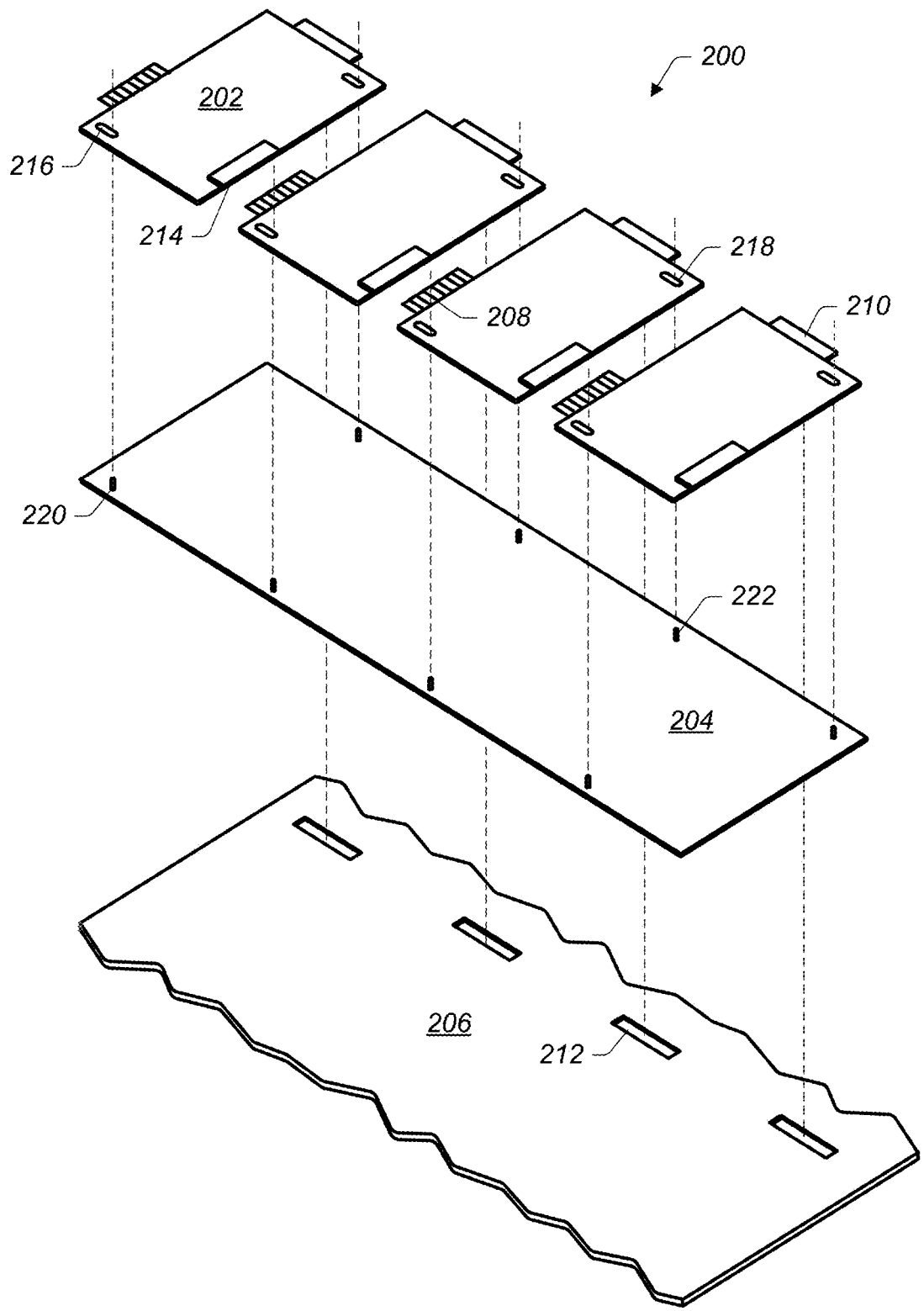
FIG. 2 illustrates an exploded view of a modular expansion card bus including multiple expansion cards, a tray for aligning the expansion cards, and a motherboard to which the expansion cards connect, according to some embodiments.

FIG. 2 illustrates an exploded view of a modular expansion card bus including multiple expansion cards, a tray for aligning the expansion cards, and a motherboard to which the expansion cards connect, according to some embodiments. Computing system 200 is assembled using expansion cards 202, tray 204, and motherboard 206. In some embodiments, any of the computing systems described in FIGS. 1 and 5-8 may be assembled as shown in FIG. 2. Expansion cards 202 include lateral printed circuit board (PCB) edge connectors 208 and top connectors 210, wherein top connectors 210 are configured to couple with connectors 212 of motherboard 102 and lateral PCB edge connectors 208 are configured to couple with corresponding lateral connectors 214 of adjacent ones of the expansion cards 202. Additionally, each of the expansion cards 202 includes mounting slot 216 configured to engage with mounting pin 220 of tray 204 and mounting slot 218 configured to engage with mounting pin 222 of tray 204. As further described below in regard to FIG. 4, the mounting slots of the expansion cards may be configured to restrict motion of the expansion cards in a vertical direction, e.g. towards or away from motherboard connectors 212, but configured to allow at least some movement of the expansion cards in a lateral direction, such as towards or away from an adjacent expansion card. This configuration may allow an expansion card to be aligned laterally with a motherboard connector, such as one of motherboard connectors 212, while already being connected to one or more adjacent expansion cards.

Figure 3:
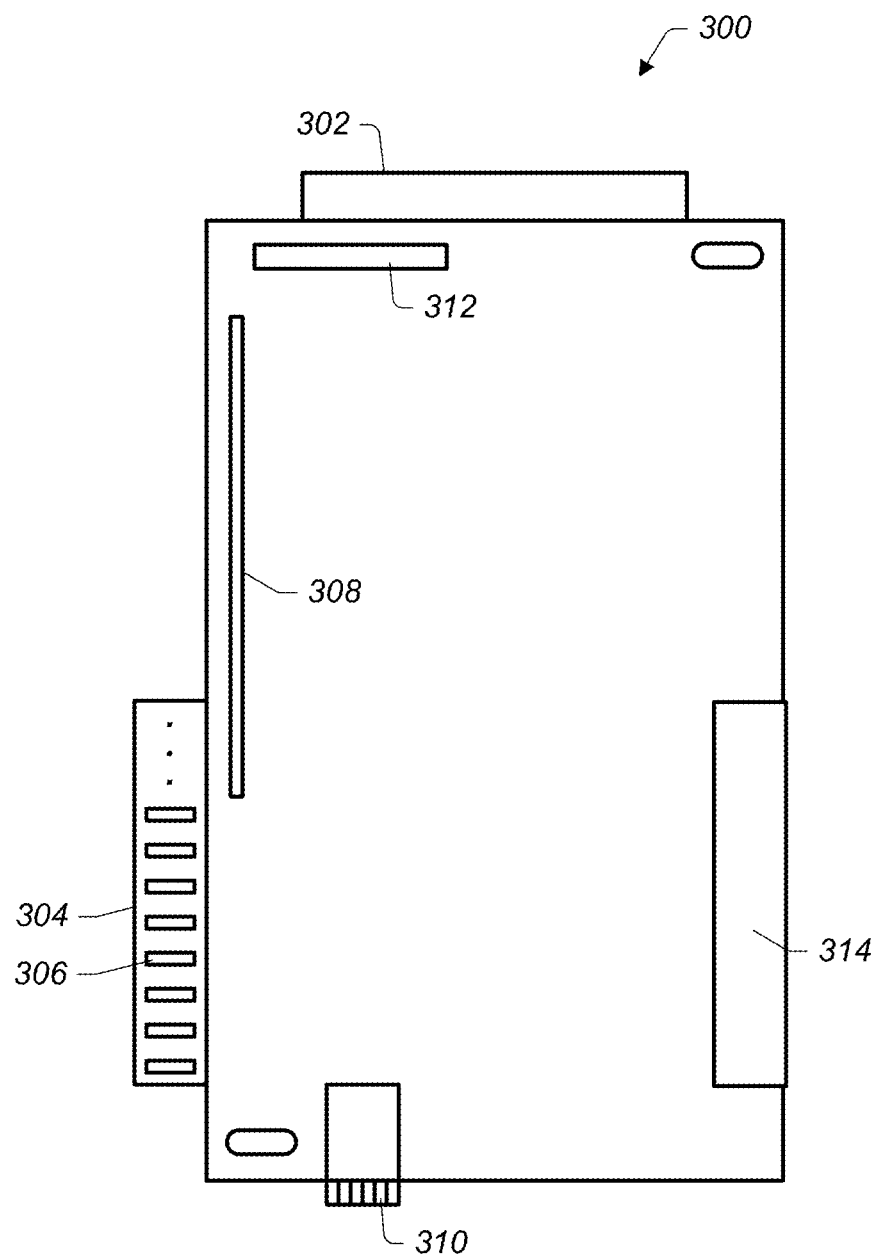
FIG. 3 illustrates a top view of an expansion card of a modular expansion card bus, according to some embodiments.

FIG. 3 illustrates a top view of an expansion card of a modular expansion card bus, according to some embodiments.

In some embodiments, an expansion card, such as expansion card 300 may include various connectors and alignment components. In some embodiments, any of the expansion cards described herein may include components as described in FIG. 3 for expansion card 300.

For example, expansion card 300 includes a top connector 302 configured to couple with a corresponding circuit board assembly, such as a motherboard. Also, expansion card 300 includes a printed circuit board (PCB) edge connector 304 configured to couple with a corresponding connector of an adjacent expansion card. In some embodiments, a PCB edge connector, such as PCB edge connector 304 may include conductive fingers, such as conductive fingers 306. In some embodiments conductive fingers may be raised gold traces on a PCB or other type of conductive traces of a printed circuit board that are configured to couple with a corresponding connector. As shown in FIG. 3, in some embodiments a PCB edge connector may include various numbers of conductive fingers. In some embodiments, conductive fingers of a PCB edge connector may be fine pitched, such that the conductive fingers are spaced approximately 0.05 to 0.06 millimeters apart. In some embodiments PCB edge connectors of an expansion card may include 200 or more I/O connections. In some embodiments, PCB edge connectors of an expansion card may include more or less I/O connections. In some embodiments, use of a PCB edge connector may save space in a chassis of a computing system by only having a single connector assembly that accepts a connection with a PCB edge connector as compared to two connector assemblies that extend above or below the expansion card.

In some embodiments, an expansion card of a modular expansion card bus, such as expansion card 300, may also include a corresponding connector, such as corresponding connector 314, configured to couple with a connector of an adjacent expansion card, such as a PCB edge connector 304 of an adjacent expansion card.

In some embodiments, an expansion card of a modular expansion card bus may include additional connectors. For example, expansion card 300 includes riser 308 and network connector 310. In some embodiments, risers, such as riser 308 may be configured to couple the expansion card to attached storage or memory, such as solid-state storage devices coupled to an expansion card. Also, in some embodiments, a network connector, such as network connector 310, may be configured to couple the expansion card to a network, such as a data center network or other type of network. In some embodiments, an expansion card, such as expansion card 300, may further include a cable connector, such as cable connector 312.

Figure 4A:
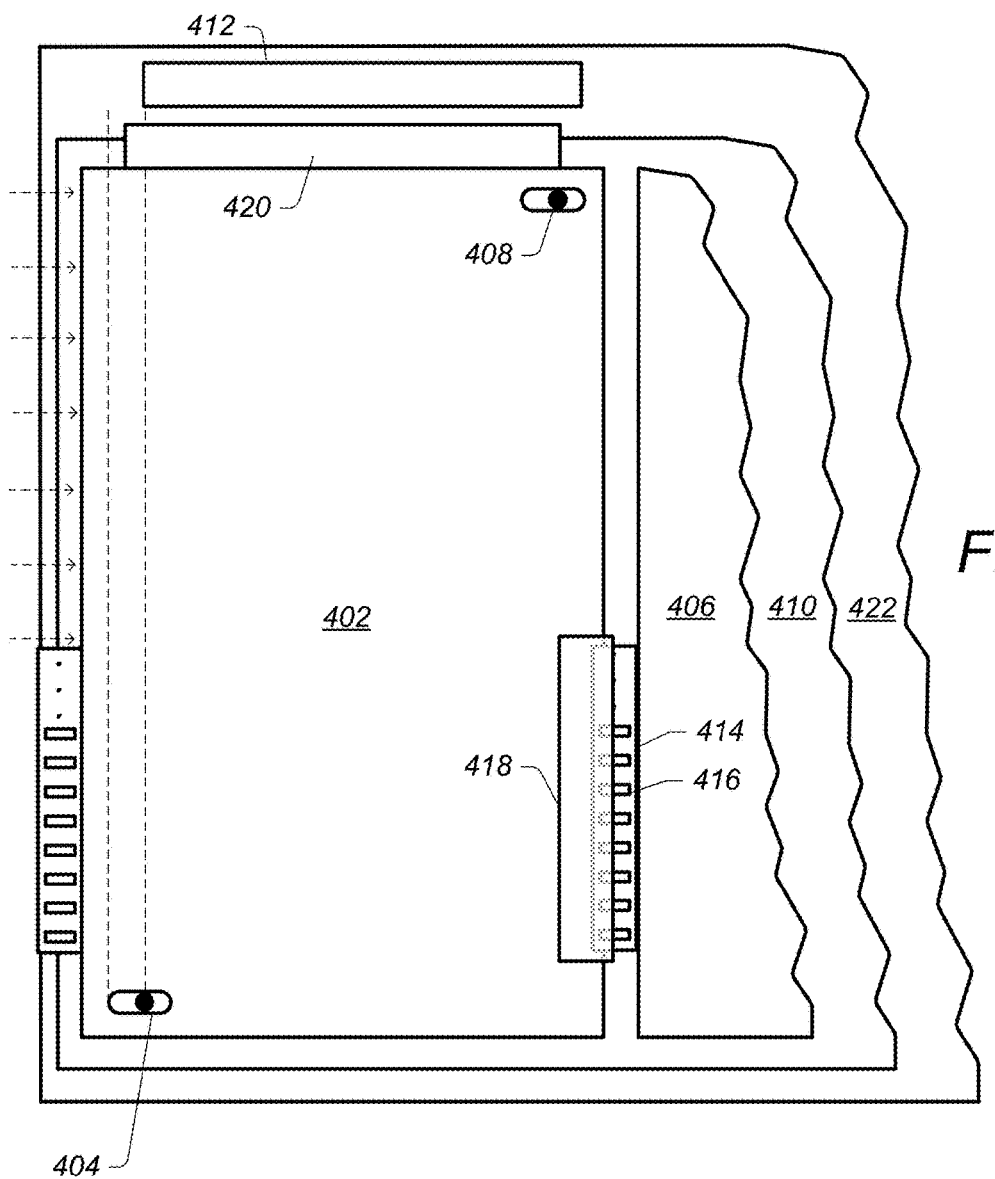
FIGS. 4A-4C illustrate lateral movement of an expansion card of a modular expansion card bus that includes mounting slots engaged with mounting pins of a mounting tray, according to some embodiments.
Figures 4B, 4C:
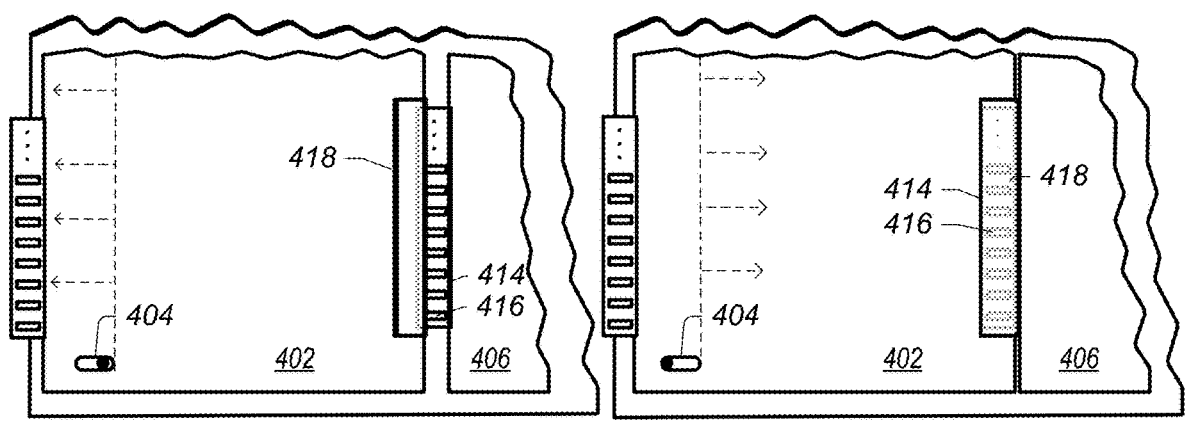

FIGS. 4A-4C illustrate lateral movement of an expansion card of a modular expansion card bus that includes mounting slots engaged with mounting pins of a mounting tray, according to some embodiments.

As previously discussed, a mounting slot of an expansion card may allow at least some movement of the expansion card in a first direction, such as a lateral direction, while restricting movement of the expansion card in a second direction, such as a vertical direction. Additionally, in some embodiments, a mounting slot of an expansion card may allow the expansion card to move laterally a distance that is shorter than a length of conductive fingers of a lateral edge connector of the expansion card. Thus, a connection between the expansion card and an adjacent expansion card may be maintained regardless of how the expansion card is moved within the allowed movement of the mounting slot engaged with a mounting pin of a tray upon which the expansion card is mounted.

For example, expansion card 402 includes mounting slots 404 that allow at least some lateral movement of expansion card 402 towards or away from adjacent expansion card 406, when engaged with mounting pins 408 of tray 410. However, mounting slots 404, when engaged with mounting pins 408 of tray 410 may restrict movement of expansion card 402 in a vertical direction towards or away from motherboard connector 412 of motherboard 422. However, tray 410 may be unconstrained from being adjusted towards or away from motherboard connector 412. Thus, in some embodiments, a plurality of expansion cards may be connected to one another while mounted on a tray, such as tray 410. The tray may then be placed on a motherboard, and individual ones of the expansion cards may be adjusted side-to-side to align a top edge connector 420 of the expansion cards with a corresponding motherboard connector, such as motherboard connector 412. Once each of the expansion cards are aligned with its respective motherboard connector, a tray upon which the expansion cards are mounted, such as tray 410, may be vertically moved towards the motherboard connectors to cause the respective top edge connectors 420 of the expansion cards to couple with the corresponding motherboard connectors, such as motherboard connector 412.

In some embodiments, as shown in FIGS. 4B and 4C, a mounting slot of an expansion card and a printed circuit board edge connector of an expansion card may be configured such that the expansion card may be adjusted to a first or second lateral limit of the mounting slot without breaking a connection between the conductive fingers of the printed circuit board edge connector and a corresponding connector of an adjacent expansion card. For example, in FIG. 4B expansion card 402 is adjusted to a left lateral limit while at least a portion of conductive fingers 416 of lateral edge connector 414 of adjacent expansion card 406 remain engaged with corresponding connector 418 of expansion card 402. Also, as shown in FIG. 4C expansion card 402 is adjusted to a right lateral limit while conductive fingers 416 of lateral edge connector 414 of adjacent expansion card 406 remain engaged with corresponding connector 418 of expansion card 402.

Figure 5A:
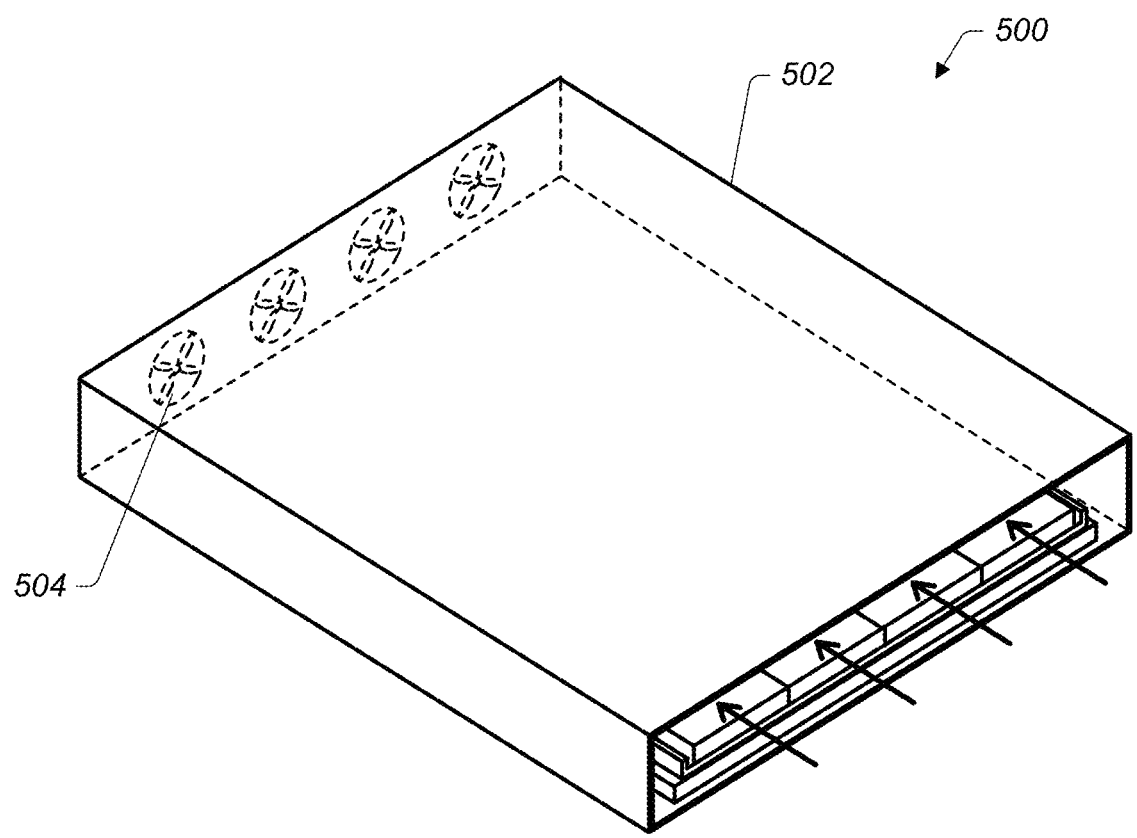
FIG. 5A is perspective view of a computing system chassis that includes a modular expansion card bus and an unobstructed air flow space, according to some embodiments.
Figure 5B:
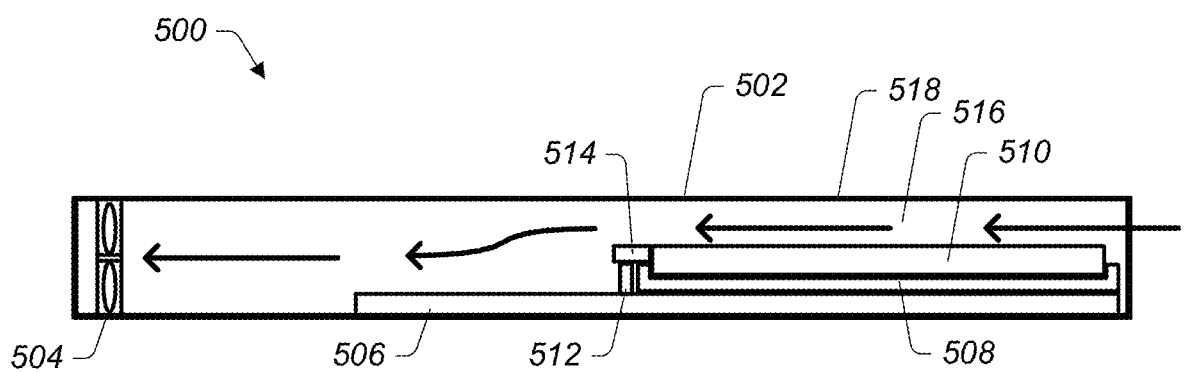
FIG. 5B is a side view of a computing system chassis that includes a modular expansion card bus and an unobstructed air flow space, according to some embodiments.

FIG. 5A is perspective view of a computing system chassis that includes a modular expansion card bus and an unobstructed air flow space, according to some embodiments. FIG. 5B is a side view of a computing system chassis that includes a modular expansion card bus and an unobstructed air flow space, according to some embodiments. Any of the computing systems described herein may be mounted in a chassis as shown in FIGS. 5A and 5B.

Computing system 500 includes chassis 502 comprising fans 504, circuit board assembly 506, tray 508, and expansion cards 510 coupled together to form a modular expansion card bus, wherein the expansion cards are connected to circuit board assembly 506 via respective risers 512 coupled to top edge connectors 514. Additionally, chassis 502 includes air flow space 516 between expansion cards 510 and a side of chassis 502, such as top side 518 of chassis 502. As can be seen in FIG. 5B, connections between adjacent expansion cards 510 and circuit board assembly 506 do not obstruct air flow space 516, as would be the case if cabling were used to connect expansion cards to one another and/or to circuit board assembly 506.

Figure 6:
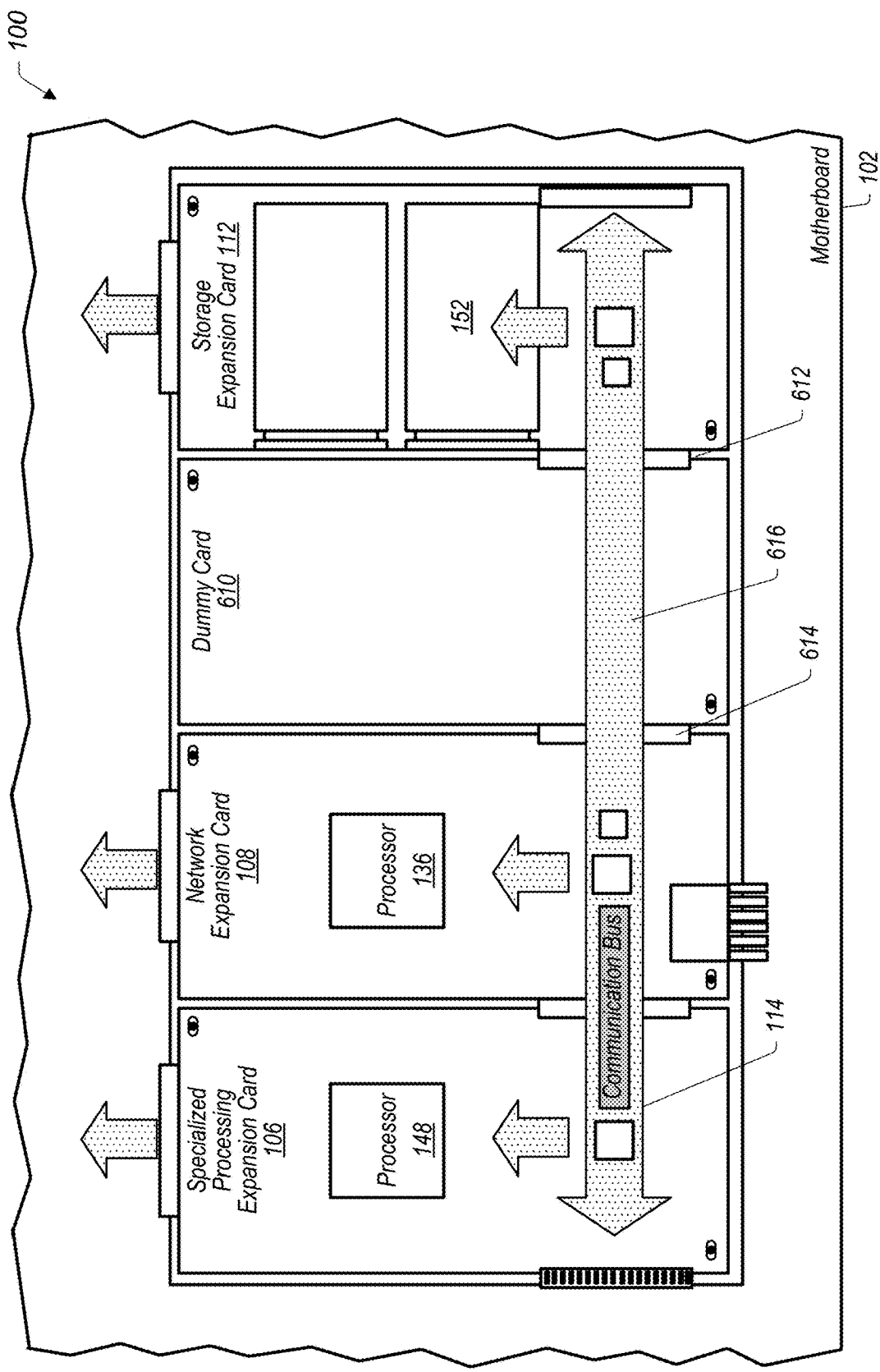
FIG. 6 illustrates a modular expansion card bus comprising a dummy card, according to some embodiments.

FIG. 6 illustrates a modular expansion card bus comprising a dummy card, according to some embodiments.

In some embodiments, a modular expansion card may include one or more dummy cards that provide a communication path between respective connectors, but may otherwise not include additional components, such as processors, storage mediums, networking connections, etc. In some embodiments, a dummy card may be installed in a modular expansion card bus during initial installation. For example, other expansion cards of the modular expansion card bus may provide required capabilities for a particular computing system, such that an additional expansion card is not needed to provide the required capabilities. Also, in some embodiments, a dummy card may be included in a modular expansion card bus to replace a failed card or to scale down capabilities of the expansion cards of the modular expansion card bus. In some embodiments, a dummy card may be considerably less expensive than an expansion card, such as a specialized processing expansion card, network expansion card, memory expansion card, storage expansion card, etc.

For example, FIG. 6 illustrates a similar modular expansion card bus as illustrated in FIG. 1. However, memory expansion card 110 has been replaced with dummy card 610. In some embodiments, dummy card 610 may include a lateral edge connector 612 and an additional connector 614 configured to couple with a lateral edge connector of network expansion card 108. Also, in some embodiments, a dummy card, such as dummy card 610 may include a direct communication path 616 between a lateral edge connector, such as lateral edge connector 612, and an additional connector, such as additional connector 614. In some embodiments, a dummy card may include one or more re-drivers or re-timers.

In some embodiments, various combinations of expansion cards may be included in a modular expansion card bus.

Figure 7:
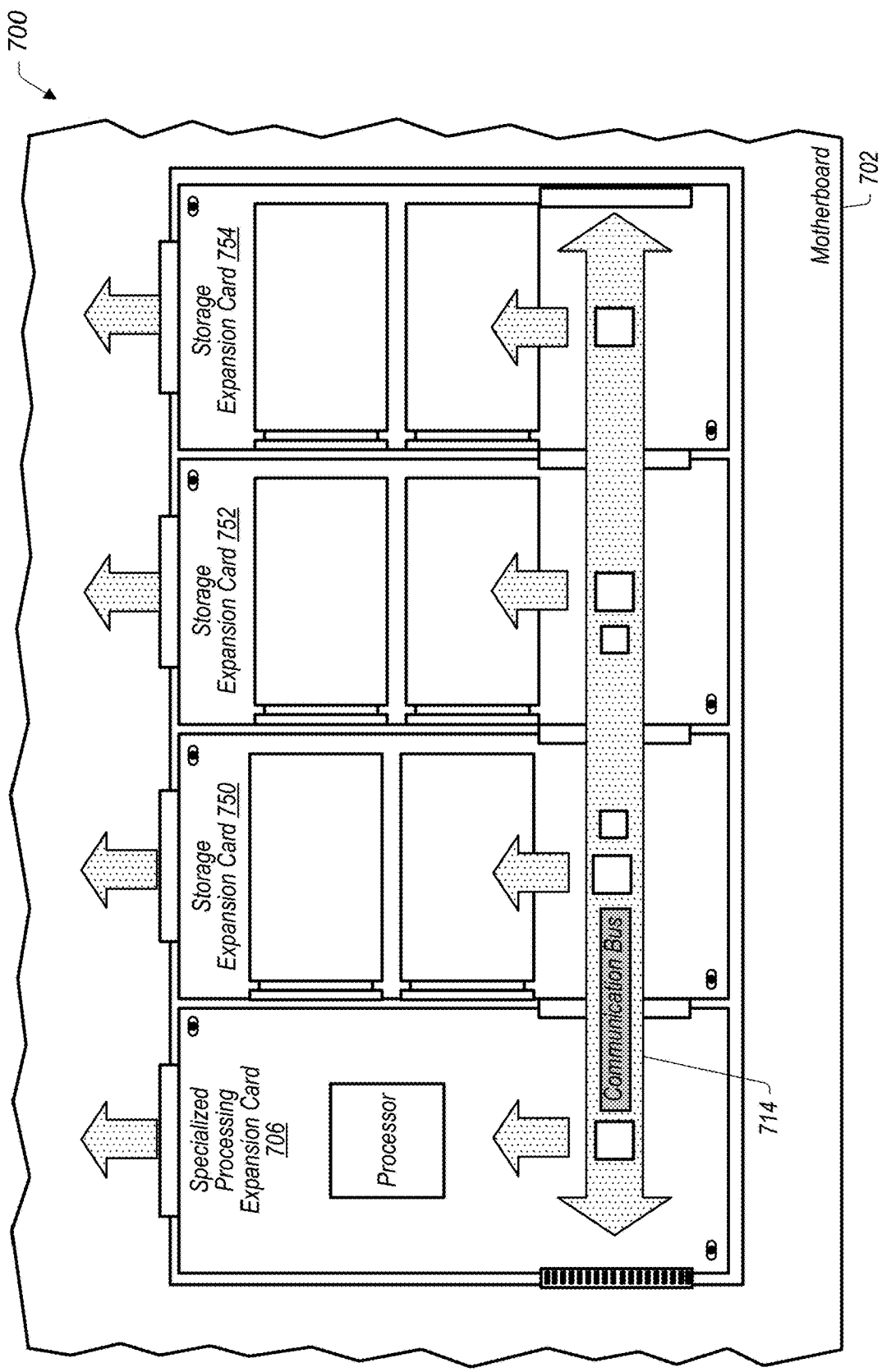
FIG. 7 illustrates an example combination of modular expansion cards included in a modular expansion card bus, according to some embodiments.

FIG. 7 illustrates an example combination of modular expansion cards included in a modular expansion card bus, according to some embodiments.

For example computing system 700 illustrated in FIG. 7 may be designed to provide additional storage capacity as compared to computing system 100 illustrated in FIG. 1. Computing system 700 includes motherboard 702 and three storage expansion cards, storage expansion cards 750, 752, and 754 coupled together along with specialized processing expansion card 706 to form modular expansion card bus 714.

Figure 8:
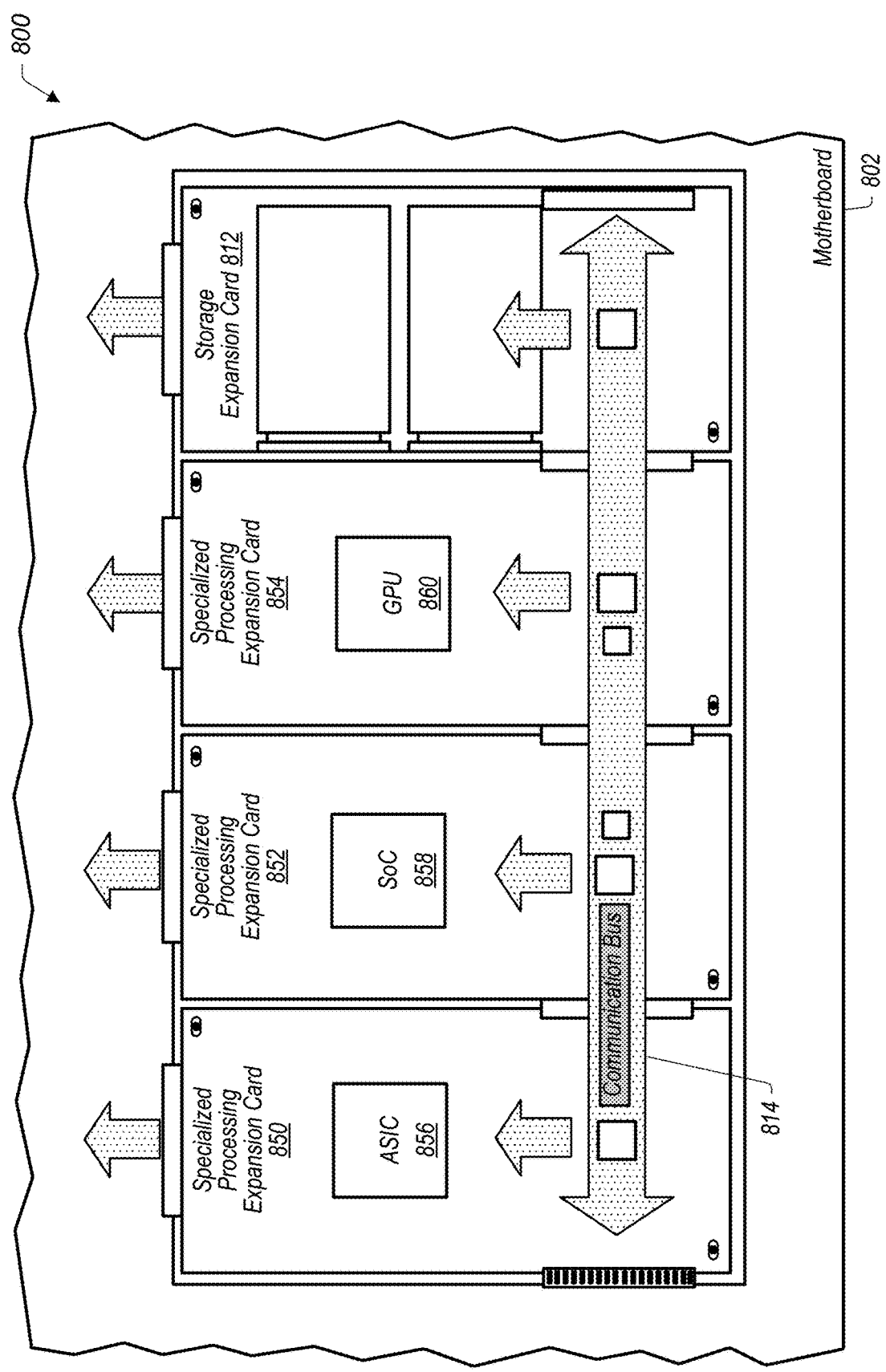
FIG. 8 illustrates another example combination of modular expansion cards included in a modular expansion card bus, according to some embodiments.

FIG. 8 illustrates another example combination of modular expansion cards included in a modular expansion card bus, according to some embodiments.

For example computing system 800 illustrated in FIG. 8 may be designed to provide additional specialized processing capability as compared to computing system 100 illustrated in FIG. 1. Computing system 800 includes motherboard 802 and three specialized processing expansion cards, specialized processing expansion cards 850, 852, and 854 coupled together along with storage expansion card 812 to form modular expansion card bus 814. In some embodiments, specialized processing expansion cards, such as specialized processing expansion cards 850, 852, and 854, may include different types of processors that provide specialized processing capacity. For example, specialized processing card 850 includes application specific integrated circuit (ASIC) 856, specialized processing expansion card 852, includes system on a chip (SoC) 858, and specialized processing card 854 includes graphics processing unit (GPU) 860. In some embodiments, expansion cards of a modular expansion card bus may include various other types of processors, networking cards, memory cards, storage cards, etc.

Figure 9:
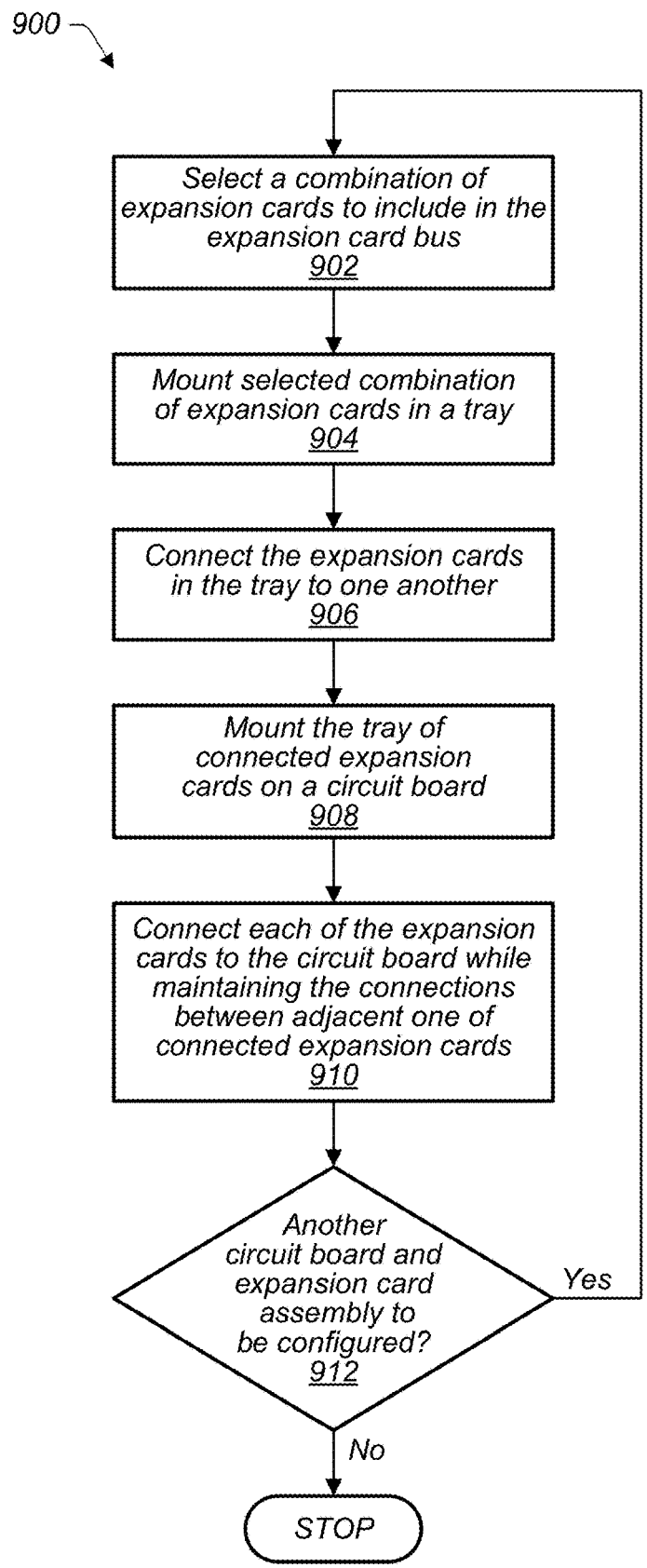
FIG. 9 illustrates a method of producing a computing system with a modular expansion card bus, according to some embodiments.

FIG. 9 illustrates a method of producing a computing system with a modular expansion card bus, according to some embodiments.

At 902 a combination of expansion cards to be included in a modular expansion card bus are selected. For example, in some embodiments the combination may be selected from a set of multiple types of expansion cards, such as specialized processing expansion cards, networking expansion cards, memory expansion cards, storage expansion cards, etc. Additionally, in some embodiments, the combination of expansion cards may be selected from a set of different types of expansion cards that include sub-types of expansion cards having different capabilities. For example, specialized processing expansion cards may include GPU expansion cards, ASIC expansion cards, SoC expansion cards, FPGA expansion cards, or expansion cards including various combinations of components such as GPUs, SoCs, ASICs, FPGAs, etc. In some embodiments, the different types and sub-types of expansion cards may have equivalent form factors and first and second connectors such that the different types of expansion cards may be interchangeably connected to form a modular expansion card bus.

At 904, the selected combination of expansion cards may be mounted in a tray of the computing system. For example, mounting slots of the expansion cards may be engaged with mounting pins of the tray. At 906, the expansion cards may be connected to one another. For example lateral edge connectors of the expansion cards may be coupled with corresponding connectors of adjacent expansion cards. At 908, the tray of connected expansion cards may be mounted on a circuit board assembly of the computing system, such as a motherboard.

At 910 respective ones of the expansion cards mounted in the tray and connected to one another may also be connected to the circuit board assembly via second connectors that are oriented perpendicular to the first connectors. In some embodiments, connecting the second connectors with corresponding connectors of a circuit board assembly, such as a motherboard, may include adjusting one or more of the expansion cards laterally to align the second connector of the expansion card with the corresponding connector of the circuit board assembly. In some embodiments a mounting slot of the expansion card may allow lateral movement of the expansion card to align the second connector of the expansion card with the corresponding connector of the circuit board assembly, while restricting movement of the expansion card in a second direction, such as a vertical direction. Once the second connectors of the expansion cards are aligned with the respective corresponding connectors of the circuit board assembly, the tray and the expansion cards mounted in the tray may be pushed slightly upward in a vertical direction to couple the expansion cards with the corresponding connectors of the circuit board assembly.

In some embodiments, process 900 described above may be automated and performed by an automated circuit board assembly apparatus. For example, in some embodiments, at 912, the automated process may determine if another circuit board expansion card assembly is to be configured, and if so automatically perform 902-910 for another circuit board assembly. If not, the process may stop.

Figure 10:
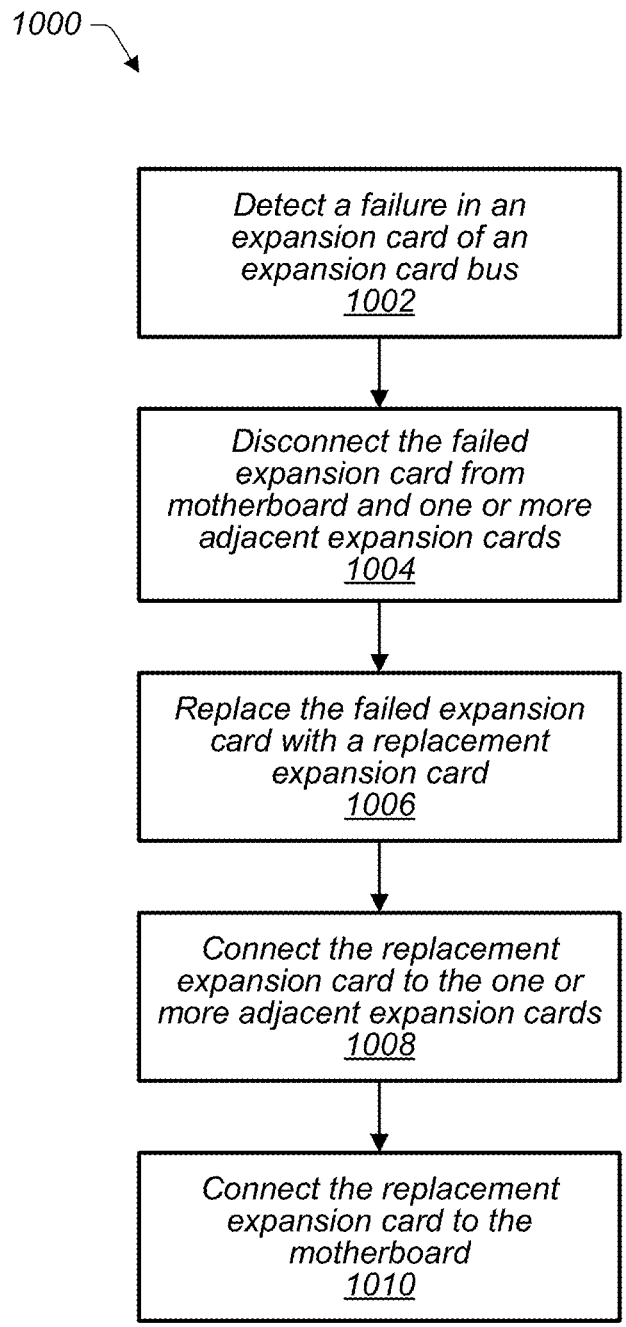
FIG. 10 illustrates a method of replacing a failed expansion card of a modular expansion card bus, according to some embodiments.

FIG. 10 illustrates a method of replacing a failed expansion card of a modular expansion card bus, according to some embodiments.

At 1002 of process 1000, a failure is detected in an expansion card of a modular expansion card bus. In response to the failure being detected, at 1004, the failed expansion card is disconnected from a motherboard of a computing system that includes the modular expansion card bus and is also disconnected from one or more adjacent expansion cards. At 1006, the failed expansion card is replaced with a replacement expansion card. At 1008 the replacement expansion card is connected to the one or more adjacent expansion cards via lateral connectors and at 1010 the replacement expansion card is connected to the motherboard via a top connector of the replacement expansion card.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system, comprising:
   a card comprising:
      a connector on a first edge of the card configured to couple with a corresponding connector of a circuit board such that the card and the circuit board are oriented parallel to one another;
      a connector on a second edge of the card configured to couple with a corresponding connector of an adjacent card mounted in a same plane as the card; and
      a mounting slot configured to restrict movement of the card in a first direction and allow at least some movement of the card in a second direction, wherein the mounting slot is configured to limit the movement of the card in the second direction to a distance that is less than a width of the connector on the second edge of the card.

2. The system of claim 1, wherein the card is:
   a networking expansion card;
   a storage expansion card;
   a memory expansion card; or
   a processing expansion card.

3. The system of claim 1, wherein the connector on the second edge of the card is a printed circuit board (PCB) edge connector comprising conductive fingers, which are configured to couple with a corresponding connector of the adjacent card.

4. The system of claim 1, wherein the card further comprises re-drivers or re-timers to facilitate transmitting signals between the card and the adjacent card.

5. The system of claim 4, wherein the card further comprises one or more switches configured to direct signals to:
   an adjacently connected card;
   a circuit included on the card; or
   the circuit board coupled to the card via the connector on the first edge of the card.

6. The system of claim 4, wherein the card is configured to transmit signals to the adjacent card without routing the signals through the circuit board, wherein the circuit board is a motherboard and the card and the adjacent card are expansion cards coupled to the motherboard.

7. The system of claim 6, wherein the card comprises:
   a system on a chip (SoC);
   an application specific integrated circuit (ASIC);
   a field programmable gate array (FPGA); or
   graphic processing unit (GPU).

8. The system of claim 6, wherein the card comprises one or more solid-state storage devices or memory devices.

9. The system of claim 1, wherein the adjacent card is a dummy card comprising a connector on each of two edges of the dummy card, wherein the dummy card is configured to provide a communication path between the card and another card.

10. The system of claim 1, wherein the system is configured such that the card is configured to be:
   disconnected from the circuit board and the adjacent card; and
   replaced with another card or a dummy card.

11. The system of claim 1, wherein the connector on the first edge of the card is oriented perpendicular to the connector on the second edge of the card.

12. The system of claim 1, wherein the mounting slot of the card is configured to engage with a mounting pin of a tray.

13. The system of claim 12, wherein the mounting slot of the card is configured to:
   restrict motion of the card relative to the mounting pin of the tray in the first direction; and
   permit motion of the card relative to the mounting pin of the tray in the second direction.

14. The system of claim 1, wherein the card is a processing expansion card comprising one or more specialized processors and the adjacent card is a memory expansion card comprising one or more memory devices,
   wherein the processing expansion card is configured to transmit signals to the memory expansion card via the connector on the second edge coupled with the corresponding connector of the memory expansion card without routing the signals through the circuit board to which the processing expansion card and the memory expansion card are coupled.

15. The system of claim 1, wherein the card is a processing expansion card comprising one or more specialized processors and the adjacent card is a network expansion card,
   wherein the processing expansion card is configured to transmit signals to the network expansion card via the connector on the second edge coupled with the corresponding connector of the network expansion card without routing the signals through the circuit board to which the processing expansion card and the network expansion card are coupled.

16. The system of claim 1, wherein the card is a memory expansion card comprising one or more memory devices and the adjacent card is a processing expansion card,
   wherein the memory expansion card is configured to transmit signals to the processing expansion card via the connector on the second edge coupled with the corresponding connector of the processing expansion card without routing the signals through the circuit board to which the memory expansion card and the processor expansion card are coupled.

17. The system of claim 1, wherein the card comprises:
   a connector on a third edge of the card, wherein the connector on the third edge of the card is configured to couple with a corresponding connector of another adjacent card mounted in the same plane as the card.

18. The system of claim 17, wherein the connectors on the second and third edges of the card are oriented perpendicular to the connector on the first edge of the card.

19. The system of claim 18, wherein the card is configured to couple with the adjacent card and the other adjacent card to form a modular expansion card bus configured to route communication signals between the card, the adjacent card, and the other adjacent card without routing the communication signals through the circuit board to which the card, the adjacent card, and the other card are coupled.

* * * * *